(12) United States Patent
Winstead et al.

(10) Patent No.: US 7,985,649 B1
(45) Date of Patent: Jul. 26, 2011

(54) METHOD OF MAKING A SEMICONDUCTOR STRUCTURE USEFUL IN MAKING A SPLIT GATE NON-VOLATILE MEMORY CELL

(75) Inventors: Brian A. Winstead, Austin, TX (US);
Cheong M. Hong, Austin, TX (US);
Sung-Taeg Kang, Austin, TX (US);
Konstantin V. Loiko, Austin, TX (US);
Spencer E. Williams, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 29 days.

(21) Appl. No.: 12/683,972

(22) Filed: Jan. 7, 2010

(51) Int. Cl.
*H01L 21/336* (2006.01)

(52) U.S. Cl. ........ 438/260; 438/261; 438/264; 438/283; 438/287; 438/288; 257/E21.179; 257/E21.18; 257/E21.209; 257/E21.21

(58) Field of Classification Search ........... 438/260, 438/261, 264, 283, 287, 288; 257/E21.179, 257/E21.18, E21.209, E21.21
See application file for complete search history.

(56) References Cited

U.S. PATENT DOCUMENTS

| | | | | | |
|---|---|---|---|---|---|
| 4,313,256 | A | * | 2/1982 | Widmann | 438/297 |
| 4,794,565 | A | * | 12/1988 | Wu et al. | 365/185.15 |
| 5,029,130 | A | * | 7/1991 | Yeh | 365/185.31 |
| 5,830,771 | A | * | 11/1998 | Fukatsu et al. | 438/257 |
| 6,015,736 | A | * | 1/2000 | Luning et al. | 438/264 |
| 6,200,859 | B1 | * | 3/2001 | Huang et al. | 438/264 |
| 6,313,498 | B1 | * | 11/2001 | Chen | 257/316 |
| 6,323,115 | B1 | * | 11/2001 | Tanabe et al. | 438/592 |
| 6,451,645 | B1 | * | 9/2002 | Ozeki et al. | 438/237 |
| 6,881,994 | B2 | * | 4/2005 | Lee et al. | 257/296 |
| 7,202,170 | B2 | * | 4/2007 | Liu et al. | 438/689 |
| 7,211,858 | B2 | * | 5/2007 | Prinz | 257/324 |
| 2009/0108325 | A1 | * | 4/2009 | Kang et al. | 257/316 |

OTHER PUBLICATIONS

U.S. Appl. No. 11/926,323, filed Oct. 29, 2007.
U.S. Appl. No. 12/103,246, filed Apr. 15, 2008.
Bhattacharya, S. et al.; "Improved Performance and Reliability of Split Gate Source-Side Injected Flash Memory Cells"; IEDM 96; 1996; pp. 13.6.1-13.6.4; IEEE.

* cited by examiner

*Primary Examiner* — Walter L Lindsay, Jr.
*Assistant Examiner* — Ron Pompey
(74) *Attorney, Agent, or Firm* — James L. Clingan, Jr.

(57) ABSTRACT

A method of making a semiconductor device on a semiconductor layer is provided. The method includes: forming a select gate dielectric layer over the semiconductor layer; forming a select gate layer over the select gate dielectric layer; and forming a sidewall of the select gate layer by removing at least a portion of the select gate layer. The method further includes growing a sacrificial layer on at least a portion of the sidewall of the select gate layer and under at least a portion of the select gate layer and removing the sacrificial layer to expose a surface of the at least portion of the sidewall of the select gate layer and a surface of the semiconductor layer under the select gate layer. The method further includes forming a control gate dielectric layer, a charge storage layer, and a control gate layer.

15 Claims, 7 Drawing Sheets

METHOD OF MAKING A SEMICONDUCTOR STRUCTURE USEFUL IN MAKING A SPLIT GATE NON-VOLATILE MEMORY CELL

BACKGROUND

1. Field

This disclosure relates generally to methods of making semiconductor structures, and more specifically, to methods useful in making a split gate non-volatile memory cell.

2. Related Art

Split gate non-volatile memories (NVMs) have been developed as providing advantages over the typical control gate over a floating gate. One advantage is that program disturb is reduced for memory cells that are unselected but are either on the selected row or in the alternative on the selected column. Normally cells on the selected row or the selected column are the most likely to be a problem for disturb regardless of the operation that is being performed on a selected cell. With the split gate memory cell having substantially solved the program disturb problem for cells on the selected rows or columns, a disturb problem with cells on unselected rows and unselected columns has become significant. One of the reasons is that the particular stress that is applied is applied for cell on unselected rows and columns is applied for many more cycles than for a stress that is applied for cells on a selected row or column.

Thus there is a need for improvement upon the issue of disturb.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A method of making a semiconductor structure useful for making split gate memory cells includes forming an undercut below the select gate in the area adjacent to where the control gate will be performed. This area includes a corner of the select gate. The corner is rounded by growing a sacrificial layer, removing the sacrificial layer, and then growing a gate dielectric for the control gate. This process has the affect of rounding the corner thus reducing the electric field emanating from the corner to an area of the substrate where unwanted carrier generation may occur for a given voltage difference between the control gate and the select gate. Thus, for a given voltage difference between the control gate and the select gate there is reduced carrier generation in the substrate arising from the electric field at the corner. With reduced carrier generation, there is less disturb of erased, unselected bits during programming. This is better understood by reference to the following description and the drawings.

The semiconductor substrate described herein can be any semiconductor material or combinations of materials, such as gallium arsenide, silicon germanium, silicon-on-insulator (SOI), silicon, monocrystalline silicon, the like, and combinations of the above. All that is shown is a top portion that is of semiconductor material.

Figure 1:
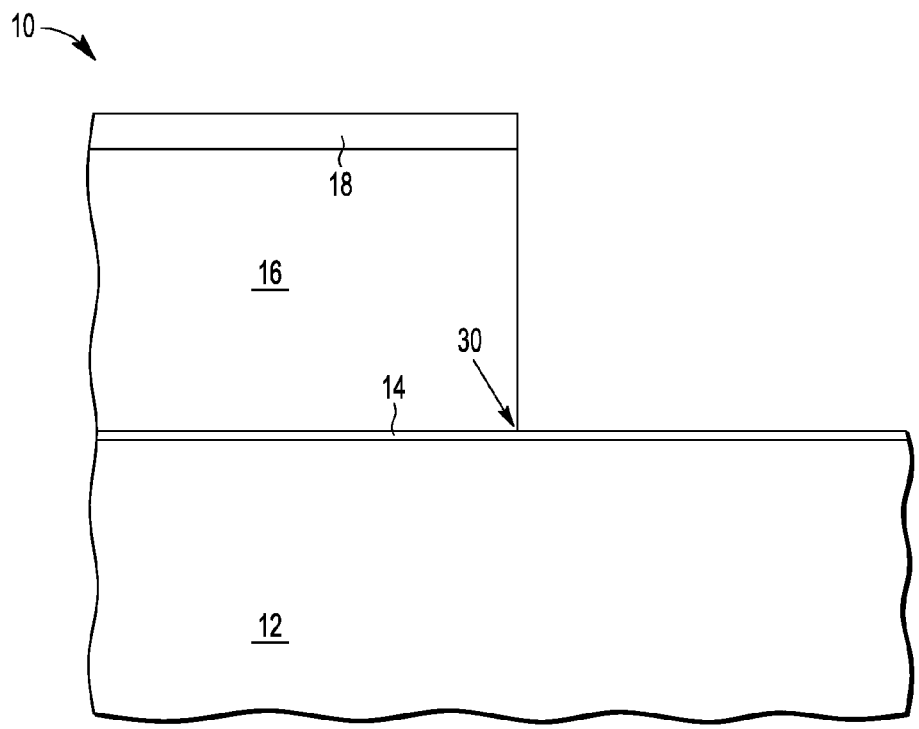
FIG. 1 is a semiconductor device at a stage in processing according to a first embodiment.

Shown in FIG. 1 is a semiconductor device 10 comprising a semiconductor substrate 12, a gate dielectric 14 on semiconductor substrate 12, a conductive layer 16, which will be used for a select gate, over a portion of gate dielectric 14, and an antireflective coating (ARC) 18 on conductive layer 16. Substrate 12 in the described example is monocrystalline silicon. Gate dielectric 14 may be a grown oxide which is common for gate dielectrics and may be 2 nanometers in thickness. A high K dielectric may also be used and would likely have a different thickness. Conductive layer 16 may be 150 nanometers in this example but could be another thickness and be of doped polysilicon. Conductive layer 16 has been etched according to a pattern to leave a side as shown in FIG. 1. The bottom portion of the side has a corner, which may be called a lower corner, that is relatively sharp. A subsequent etch of conductive layer 16 will performed to provide additional definition of a boundary of the select gate to be formed.

Figure 2:
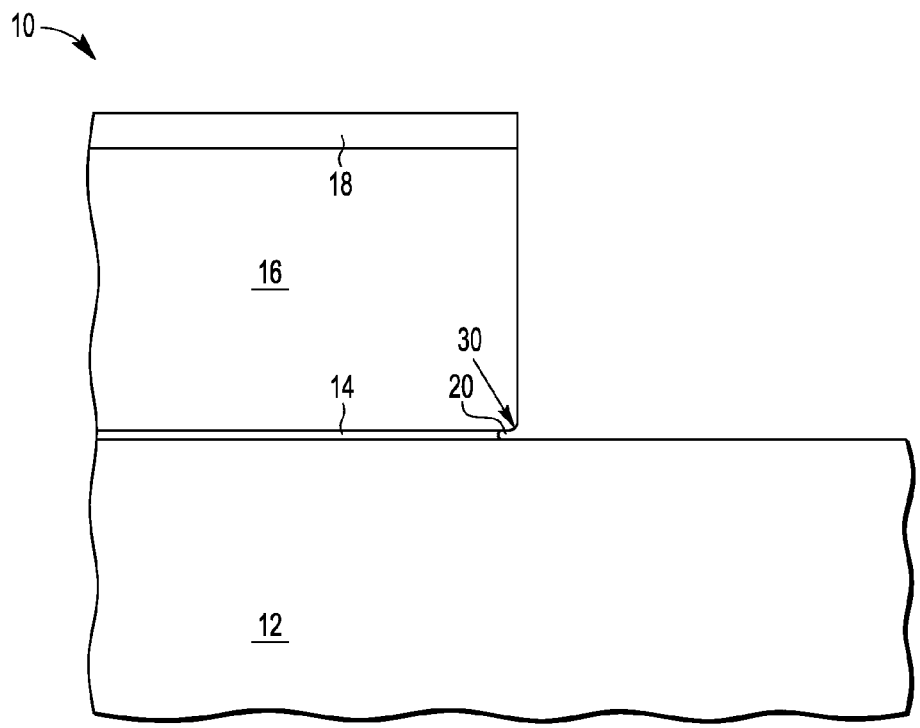
FIG. 2 is the semiconductor device of FIG. 1 at a subsequent stage in processing.

Shown in FIG. 2 is semiconductor device 10 after performing an isotropic etch to remove gate dielectric 14 in an area adjacent to the side of conductive layer 16 shown in FIGS. 1 and 2 and to etch under the lower corner to leave an undercut 20 that is under conductive layer 16 at the lower corner. For the case of gate dielectric 14 being silicon oxide, this easily achieved using an HF wet etch. Another isotropic etch may be used. For the case of gate dielectric 14 being a high K dielectric, a different etchant, one that is selective between the high K dielectric and the semiconductor material of substrate 12, could be used. Etchants are rarely perfectly selective so that a small amount of rounding of the lower corner of conductive layer 16 occurs during this etch. This etch exposes a portion of substrate 12 adjacent to the side of conductive layer 16.

Prior to performing the isotropic etch that results in undercut 20 shown in FIG. 2, one possibility is to perform a special etch that etches more where the side of conductive layer 16 contacts gate dielectric 14. This etch is known but can be difficult to control. Beginning the rounding process with this type of etch may be beneficial if it can be adequately controlled.

Figure 3:
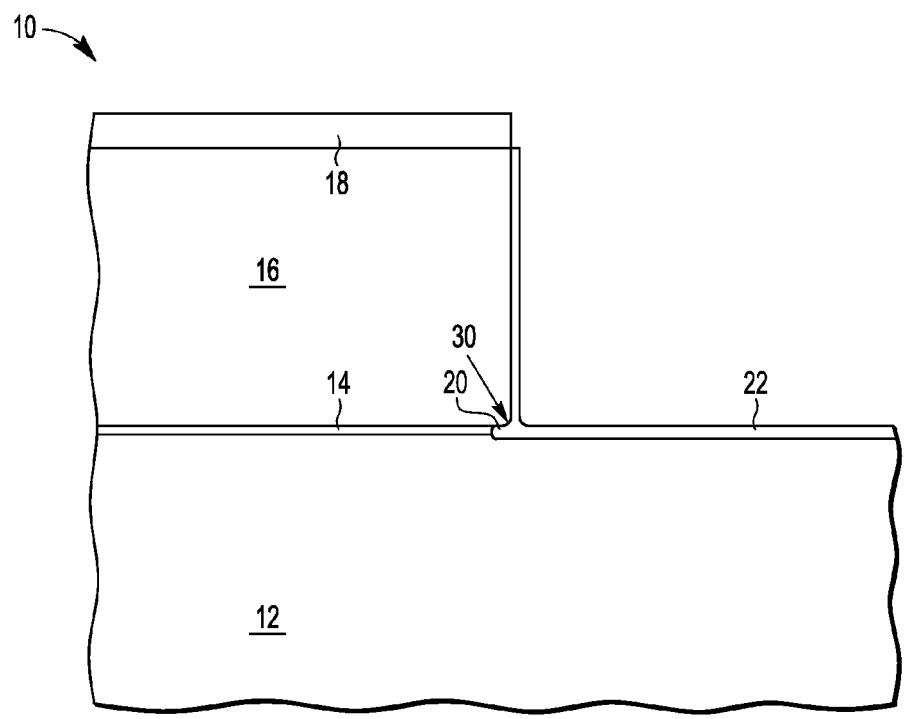
FIG. 3 is the semiconductor device of FIG. 2 at a subsequent stage in processing.

Shown in FIG. 3 is semiconductor device 10 after growing a sacrificial layer 22 on the exposed portion of substrate 12 and on the side of conductive layer 16. This may be about 5 nanometers in thickness. Sacrificial layer 22 extends into undercut 20 and has the affect of further rounding the lower corner. Sacrificial layer 22 may be silicon oxide.

Figure 4:
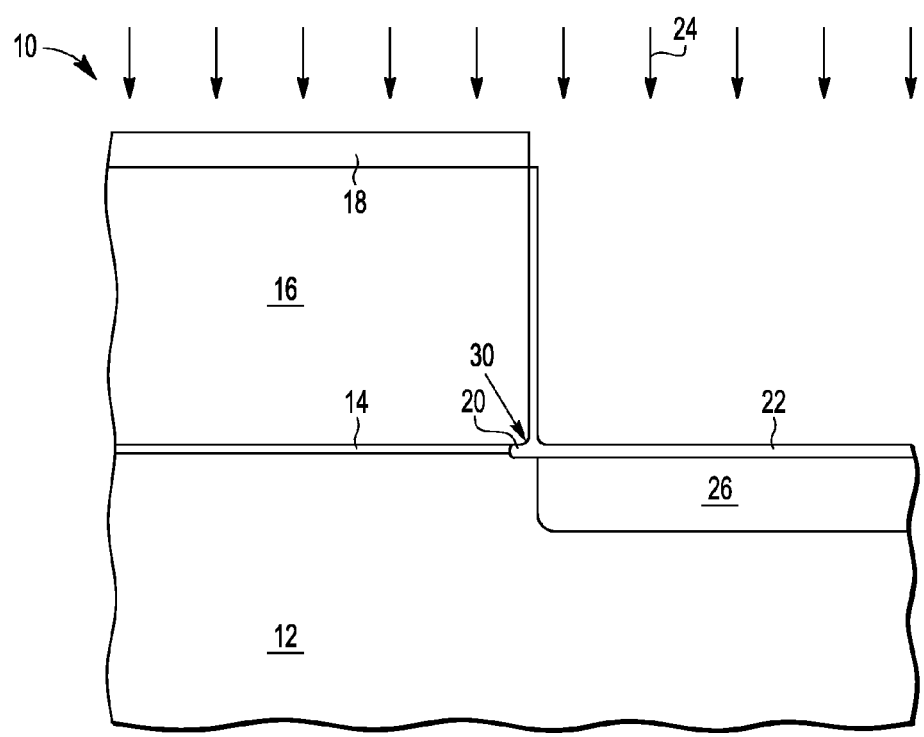
FIG. 4 is the semiconductor device of FIG. 3 at a subsequent stage in processing.

Shown in FIG. 4 is semiconductor device 10 showing an implant 24 of dopant type opposite that of substrate 12 which may be called counterdoping, to form a region 26 in substrate 26 aligned to sacrificial layer 22 on the side of conductive layer 16. Typically, substrate 12 would have a light P doping. In this example region 26 is N type resulting from implant 24.

Figure 5:
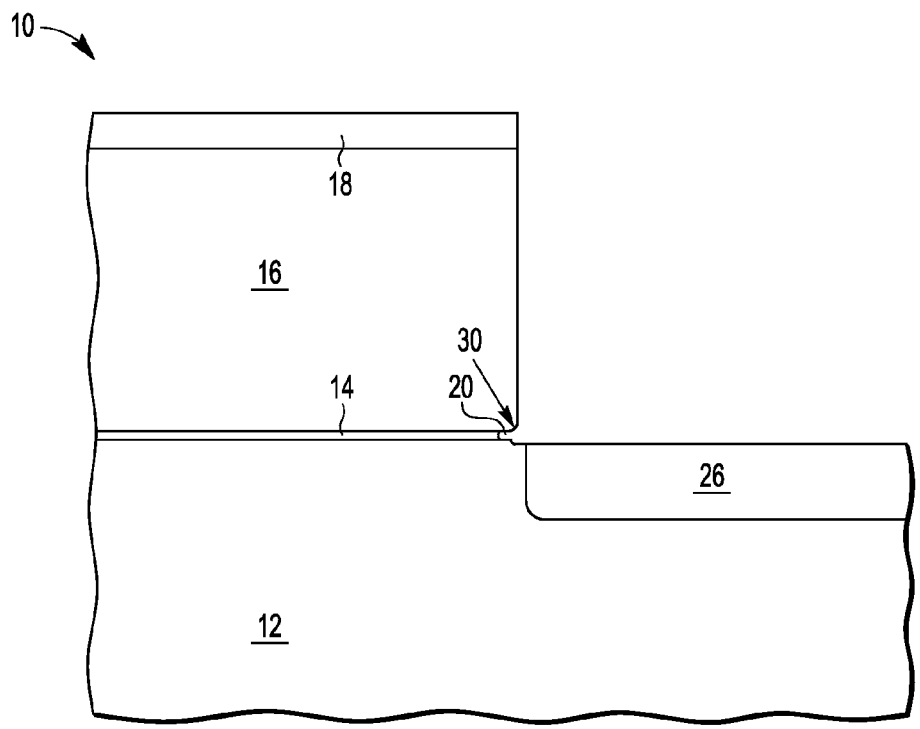
FIG. 5 is the semiconductor device of FIG. 4 at a subsequent stage in processing.

Shown in FIG. 5 is a semiconductor device 10 after removing sacrificial layer 22 again using a wet etch which may be HF. This etch effectively removes sacrificial layer 22 and further rounds the lower corner. Undercut 20 is somewhat changed in shape corresponding to the rounding of the lower corner.

Figure 6:
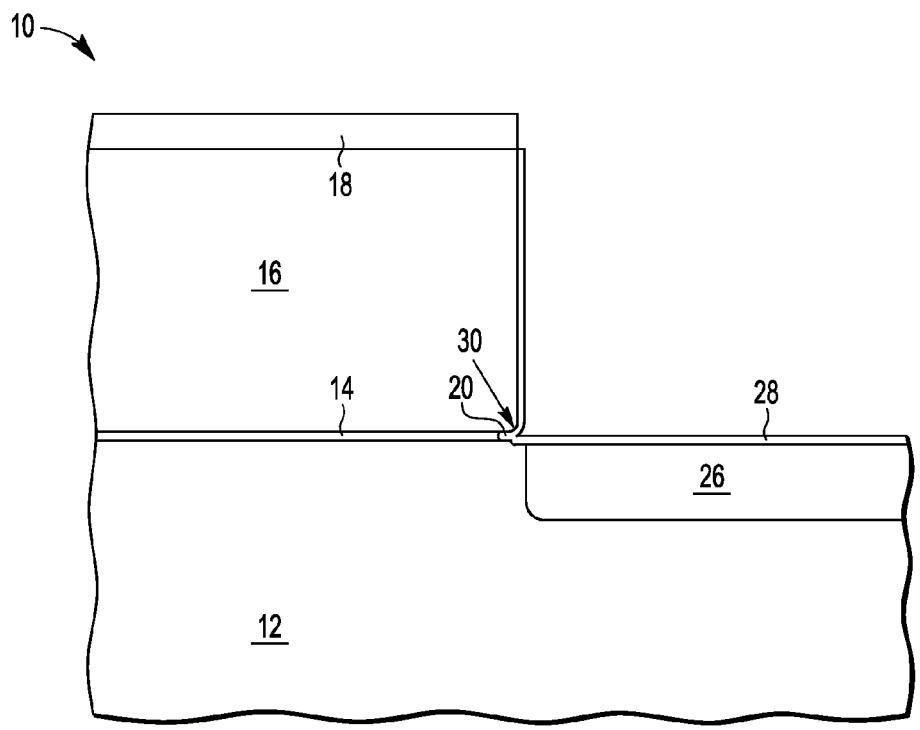
FIG. 6 is the semiconductor device of FIG. 5 at a subsequent stage in processing.

Shown in FIG. 6 is semiconductor device 10 after growing gate dielectric layer 28 which fills undercut 20 and further rounds the lower corner to result in a rounded lower corner 30. The growing of gate dielectric layer on substrate 12 also results in it growing on the side of conductive layer 16. Gate dielectric layer 28 may be about 5 nanometers in thickness. Rounded lower corner 30 results from forming undercut 20, growing sacrificial layer 22, removing sacrificial layer 22, and growing gate dielectric layer 28.

Figure 7:
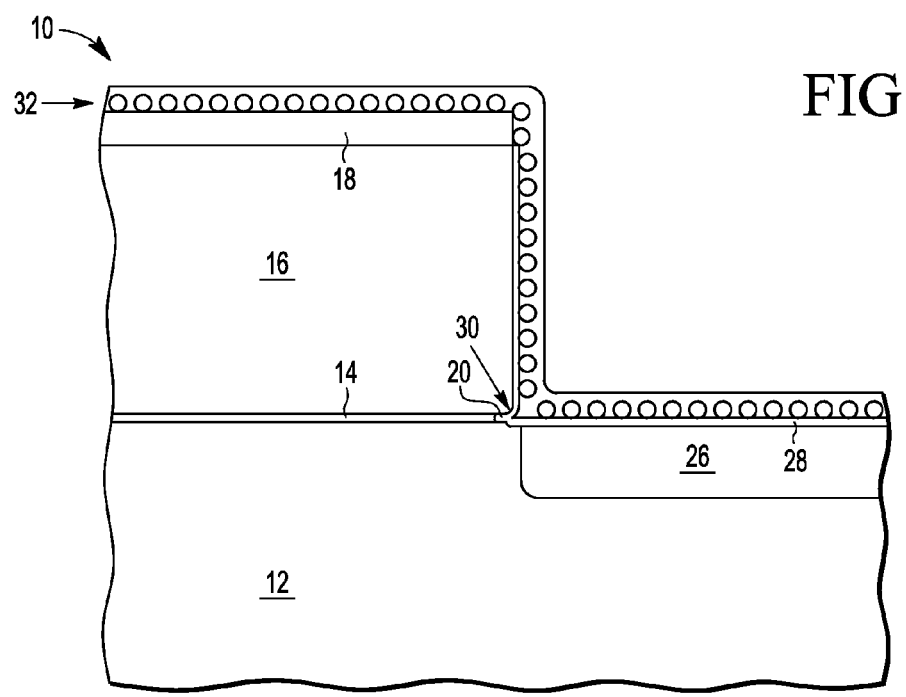
FIG. 7 is the semiconductor device of FIG. 6 at a subsequent stage in processing.

Shown in FIG. 7 is semiconductor device 10 after forming a storage layer 32 of nanocrystals and insulating material on gate dielectric 28 and ARC 18. Storage layer 32 may be a charge storage layer that uses nanocrystals as the charge storage element.

Figure 8:
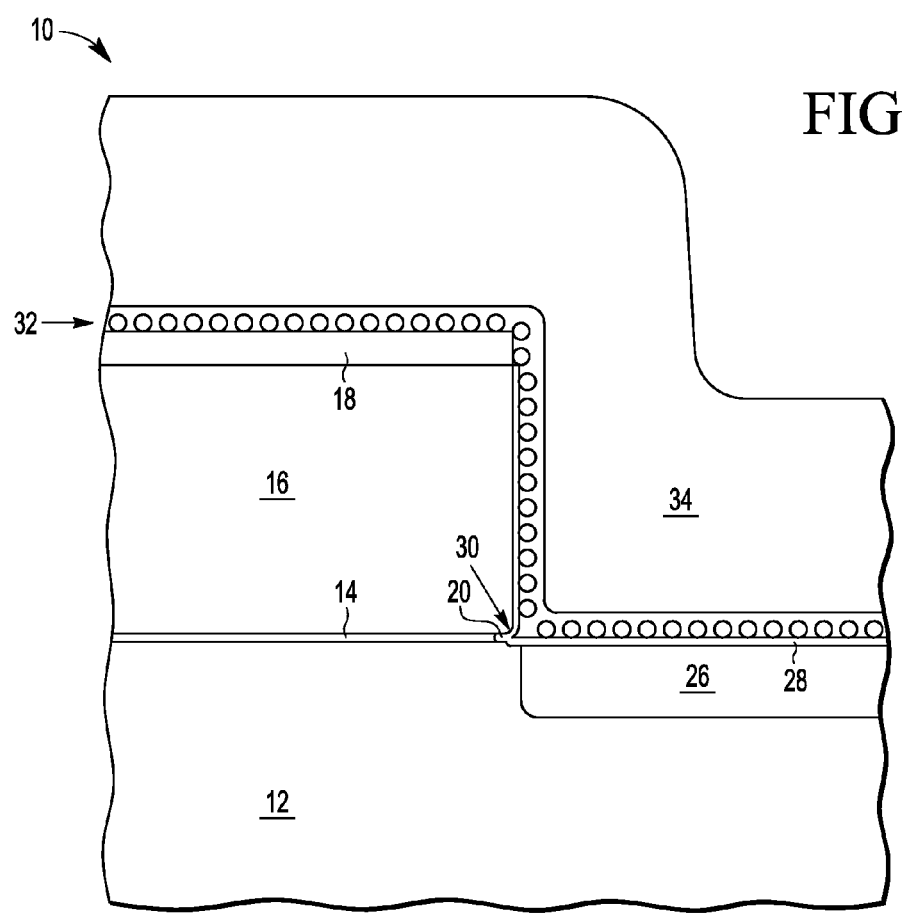
FIG. 8 is the semiconductor device of FIG. 7 at a subsequent stage in processing.

Shown in FIG. 8 is semiconductor device 10 after depositing a conductive layer 34 over storage layer 32. This may be doped polysilicon which is convenient from a processing perspective but could be another conductive material. Conductive layer 34 will be patterned in subsequent steps to result in a control gate.

Figure 9:
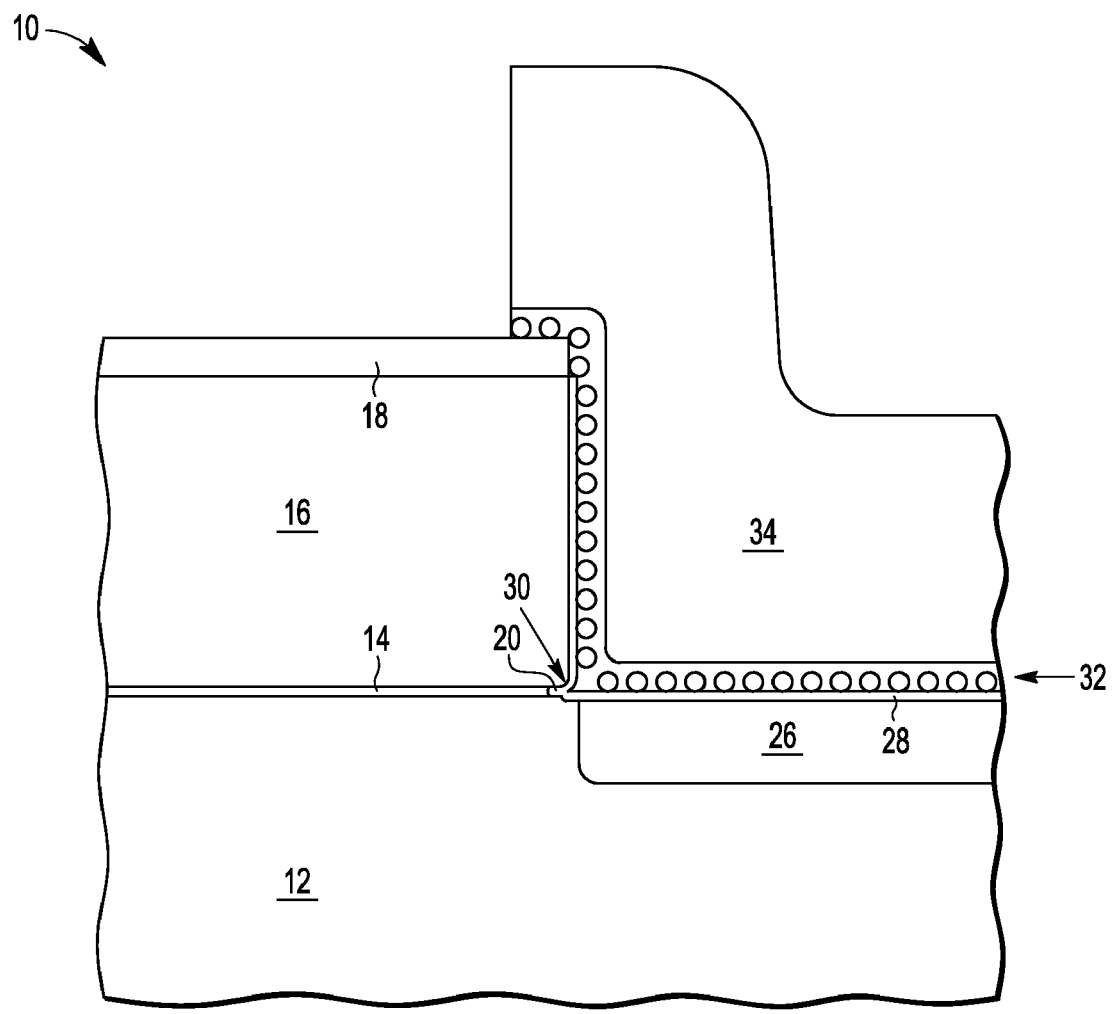
FIG. 9 is the semiconductor device of FIG. 8 at a subsequent stage in processing.

Shown in FIG. 9 is semiconductor device 10 after etching conductive layer 34 over ARC 18 to form a side of conductive layer 34 over conductive layer 16.

Figure 10:
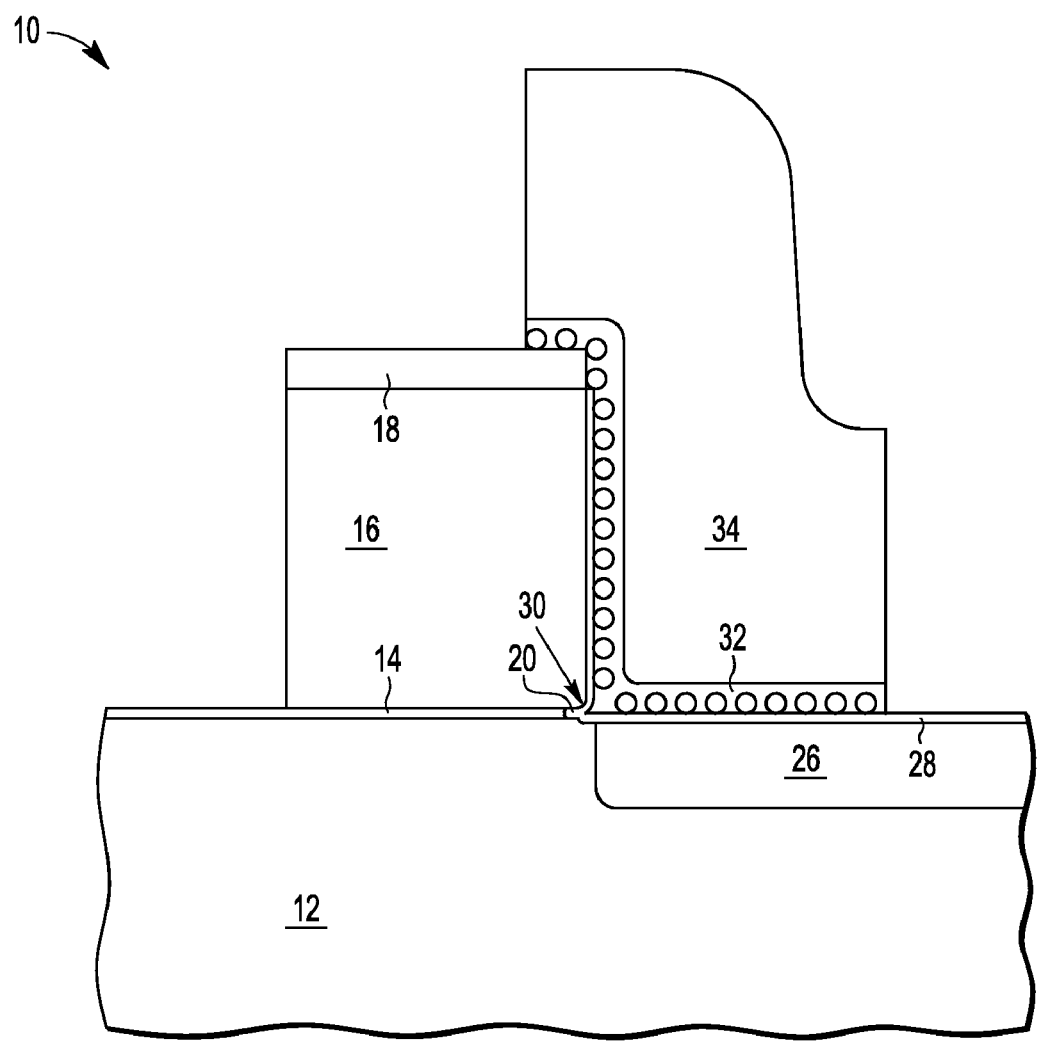
FIG. 10 is the semiconductor device of FIG. 9 at a subsequent stage in processing providing a split gate NVM cell.

Shown in FIG. 10 is semiconductor device 10 after etching conductive layer 34 and conductive layer 16 with the resulting portion of conductive layer 16 forming a select gate and the resulting portion of conductive layer 34 forming a control gate.

Figure 11:
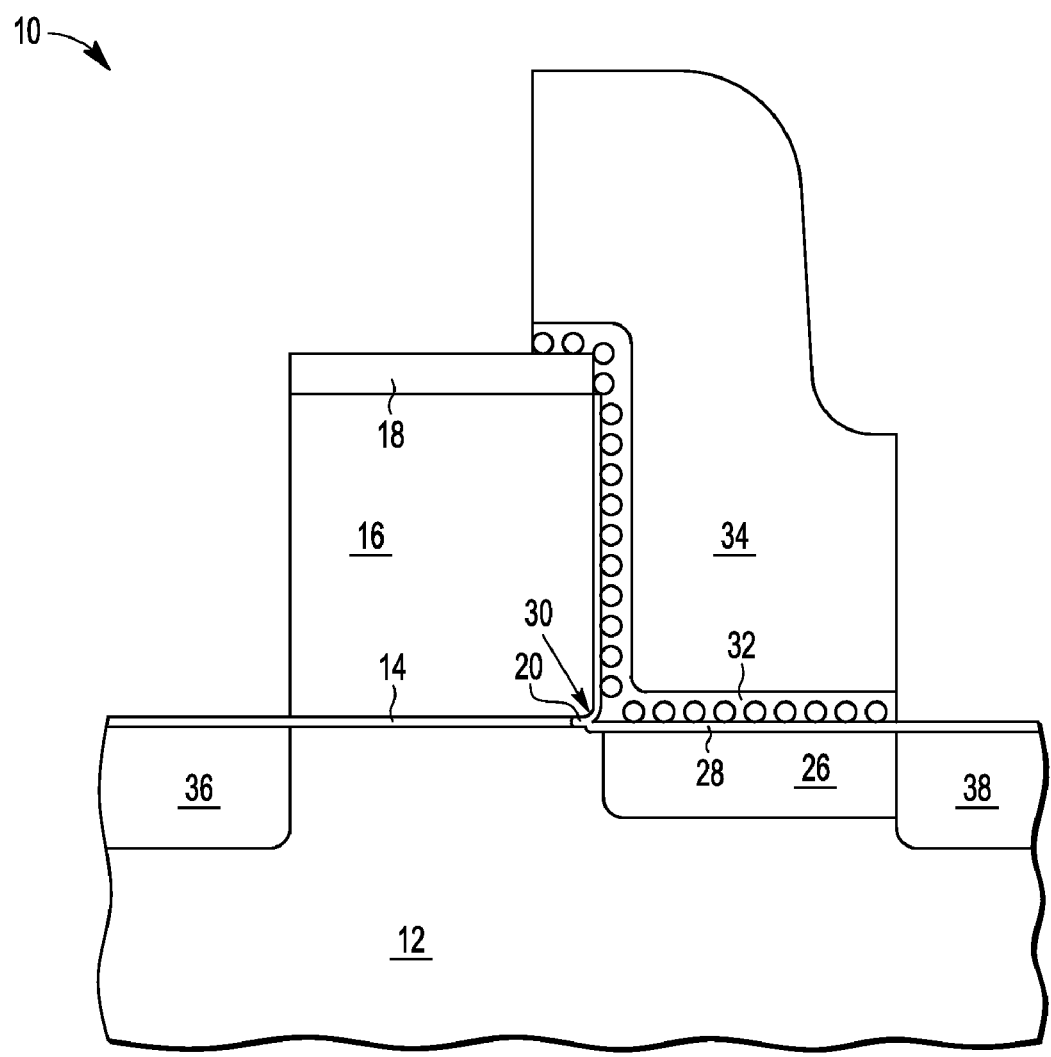
FIG. 11 is the semiconductor device of FIG. 10 at a subsequent stage in processing to provide a split gate NVM cell.

Shown in FIG. 11 is semiconductor device 10 after forming a drain 36 and a source 38 to result in a split gate non-volatile memory cell.

Rounded corner 30 is beneficial in reducing the high electric field that is generally formed at corners. The electric field is higher if the corner is sharper. With the corner rounded, the electric field is lower. A voltage differential between control gate 34 and select gate 16, which occurs when the memory cell of FIG. 11 is unselected during the programming of another cell, causes an electric field at corner 30 which extends into substrate 12 including under storage layer 32. If the electric field is high enough, unwanted carriers can be generated. If these carriers are sufficiently energetic, they can tunnel to nearby nanocrystals. Thus, rounded corner 30 by having reduced sharpness, reduces the electric field extending into substrate 12 and thus reduces carriers that can tunnel to the nanocrystals of storage layer 32.

By now it should be appreciated that there has been provided a method of making a semiconductor device on a semiconductor layer. The method includes forming a select gate dielectric layer over the semiconductor layer. The method further includes forming a select gate layer over the select gate dielectric layer. The method further includes forming a sidewall of the select gate layer by removing at least a portion of the select gate layer. The method further includes growing a sacrificial layer on at least a portion of the sidewall of the select gate layer and under at least a portion of the select gate layer. The method further includes removing the sacrificial layer to result in an exposed surface of the at least portion of the sidewall of the select gate layer and an exposed surface of the semiconductor layer under the select gate layer. The method further includes forming a control gate dielectric layer over at least a portion of the exposed surface of the semiconductor layer under the select gate layer and at least a portion of the exposed surface of the at least portion of the sidewall of the select gate layer. The method further includes. The method further includes forming a charge storage layer over the control gate dielectric layer. The method further includes forming a control gate layer over the charge storage layer. The method may have a further characterization by which the sacrificial layer comprises one of a group consisting of a sacrificial oxide layer and a sacrificial oxy-nitride layer. The method may have a further characterization by which the step of forming the charge storage layer comprises forming a layer comprising one of a group consisting of nanocrystals and nitride. The method may comprise prior to the step of removing the sacrificial layer, implanting dopants into at least a region of the semiconductor layer, wherein the region of the semiconductor layer is adjacent to the sidewall of the select gate layer. The method may comprise prior to the step of growing the sacrificial layer, removing a portion of the select gate dielectric layer underlying the select gate layer to form an undercut under the select gate layer. The method may have a further characterization by which the step of growing the sacrificial layer further comprises growing the sacrificial layer in the undercut under the select gate layer. The method may have a further characterization by which the step of removing the portion of the select gate dielectric layer underlying the select gate layer comprises selectively etching the select gate dielectric layer.

Described also is a method of making a semiconductor device on a semiconductor layer. The method includes forming a select gate dielectric layer over the semiconductor layer. The method further includes forming a select gate layer over the select gate dielectric layer. The method further includes forming a sidewall of the select gate layer by removing at least a portion of the select gate layer. The method further includes removing a portion of the select gate dielectric layer underlying the select gate layer to form an undercut under the select gate layer. The method further includes growing a sacrificial layer on at least a portion of the sidewall of the select gate layer and the undercut under the select gate layer. The method further includes removing the sacrificial layer to result in an exposed surface of the at least portion of the sidewall of the select gate layer, and an exposed surface of the semiconductor layer under the select gate layer. The method further includes forming a control gate dielectric layer over at least a portion of the exposed surface of the semiconductor layer under the select gate layer and at least a portion of the exposed surface of the at least portion of the sidewall of the select gate layer. The method further includes forming a charge storage layer over the control gate dielectric layer. The method further includes forming a control gate layer over the charge storage layer. The method may have a further characterization by which the step of removing the portion of the select gate dielectric layer underlying the select gate layer comprises selectively etching the select gate dielectric layer. The method may have a further characterization by which the sacrificial layer comprises at least one of a sacrificial oxide layer and a sacrificial oxy-nitride layer. The method may have a further characterization by which the step of forming the charge storage layer comprises forming a layer comprising at least one of nanocrystals and nitride. The method may further comprise subsequent to the step of growing the sacrificial layer, implanting dopants into at least a region of the semiconductor layer, wherein the region of the semiconductor layer is adjacent to the sidewall of the select gate layer.

Also described is a method of making a semiconductor device on a semiconductor layer. The method includes forming a select gate dielectric layer over the semiconductor layer. The method further includes forming a select gate layer over the select gate dielectric layer. The method further includes forming a sidewall of the select gate layer by removing at least a portion of the select gate layer. The method further includes removing a portion of the select gate dielectric layer underlying the select gate layer to form an undercut under the select gate layer. The method further includes growing a sacrificial layer on at least a portion of the sidewall of the select gate layer, the undercut under the select gate layer, and the notch formed in the region of the sidewall adjacent to select gate dielectric layer. The method further includes removing the sacrificial layer to expose a surface of the at least portion of the sidewall of the select gate layer, and a surface of the semiconductor layer under the select gate layer. The method further includes forming a control gate dielectric layer over at least a portion of the exposed surface of the semiconductor layer under the select gate layer and at least a portion of the exposed surface of the at least portion of the sidewall of the select gate layer. The method further includes forming a charge storage layer over the control gate dielectric layer. The method further includes forming a control gate layer over the charge storage layer. The method may have a further characterization by which the step of removing the portion of the select gate dielectric layer underlying the select gate layer comprises selectively etching the select gate dielectric layer. The method may have a further characterization by which the sacrificial layer comprises at least one of a sacrificial oxide layer and a sacrificial oxy-nitride layer. The method may have a further characterization by which the step of forming the charge storage layer comprises forming a layer comprising at least one of nanocrystals and nitride.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device on a semiconductor layer, comprising:
   forming a select gate dielectric layer over the semiconductor layer;
   forming a select gate layer over the select gate dielectric layer;
   forming a sidewall of the select gate layer by removing at least a portion of the select gate layer;
   removing a portion of the select gate dielectric layer underlying the select gate layer to form an undercut under the select gate layer;
   growing a sacrificial layer on at least a portion of the sidewall of the select gate layer and under at least a portion of the select gate layer;
   removing the sacrificial layer to result in an exposed surface of the at least portion of the sidewall of the select gate layer and an exposed surface of the semiconductor layer under the select gate layer;
   forming a control gate dielectric layer over at least a portion of the exposed surface of the semiconductor layer under the select gate layer and at least a portion of the exposed surface of the at least portion of the sidewall of the select gate layer;
   forming a charge storage layer over the control gate dielectric layer; and
   forming a control gate layer over the charge storage layer.

2. The method of claim 1, wherein the sacrificial layer comprises one of a group consisting of a sacrificial oxide layer and a sacrificial oxy-nitride layer.

3. The method of claim 1, wherein the step of forming the charge storage layer comprises forming a layer comprising one of a group consisting of nanocrystals and nitride.

4. The method of claim 1 further comprising prior to the step of removing the sacrificial layer, implanting dopants into at least a region of the semiconductor layer, wherein the region of the semiconductor layer is adjacent to the sidewall of the select gate layer.

5. The method of claim 1, wherein the step of growing the sacrificial layer further comprises growing the sacrificial layer in the undercut under the select gate layer.

6. The method of claim 1, wherein the step of removing the portion of the select gate dielectric layer underlying the select gate layer comprises selectively etching the select gate dielectric layer.

7. A method of making a semiconductor device on a semiconductor layer, comprising:
   forming a select gate dielectric layer over the semiconductor layer;
   forming a select gate layer over the select gate dielectric layer;
   forming a sidewall of the select gate layer by removing at least a portion of the select gate layer;
   removing a portion of the select gate dielectric layer underlying the select gate layer to form an undercut under the select gate layer;
   growing a sacrificial layer on at least a portion of the sidewall of the select gate layer and the undercut under the select gate layer;

removing the sacrificial layer to result in an exposed surface of the at least portion of the sidewall of the select gate layer, and an exposed surface of the semiconductor layer under the select gate layer;

forming a control gate dielectric layer over at least a portion of the exposed surface of the semiconductor layer under the select gate layer and at least a portion of the exposed surface of the at least portion of the sidewall of the select gate layer;

forming a charge storage layer over the control gate dielectric layer; and forming a control gate layer over the charge storage layer.

8. The method of claim 7, wherein the step of removing the portion of the select gate dielectric layer underlying the select gate layer comprises selectively etching the select gate dielectric layer.

9. The method of claim 7, wherein the sacrificial layer comprises at least one of a sacrificial oxide layer and a sacrificial oxy-nitride layer.

10. The method of claim 7, wherein the step of forming the charge storage layer comprises forming a layer comprising at least one of nanocrystals and nitride.

11. The method of claim 7 further comprising subsequent to the step of growing the sacrificial layer, implanting dopants into at least a region of the semiconductor layer, wherein the region of the semiconductor layer is adjacent to the sidewall of the select gate layer.

12. A method of making a semiconductor device on a semiconductor layer, comprising:

forming a select gate dielectric layer over the semiconductor layer;

forming a select gate layer over the select gate dielectric layer;

forming a sidewall of the select gate layer by removing at least a portion of the select gate layer;

removing a portion of the select gate dielectric layer underlying the select gate layer to form an undercut under the select gate layer;

growing a sacrificial layer on at least a portion of the sidewall of the select gate layer, the undercut under the select gate layer, and the notch formed in the region of the sidewall adjacent to select gate dielectric layer;

removing the sacrificial layer to expose a surface of the at least portion of the sidewall of the select gate layer, and a surface of the semiconductor layer under the select gate layer;

forming a control gate dielectric layer over at least a portion of the exposed surface of the semiconductor layer under the select gate layer and at least a portion of the exposed surface of the at least portion of the sidewall of the select gate layer;

forming a charge storage layer over the control gate dielectric layer; and forming a control gate layer over the charge storage layer.

13. The method of claim 12, wherein the step of removing the portion of the select gate dielectric layer underlying the select gate layer comprises selectively etching the select gate dielectric layer.

14. The method of claim 12, wherein the sacrificial layer comprises at least one of a sacrificial oxide layer and a sacrificial oxy-nitride layer.

15. The method of claim 12, wherein the step of forming the charge storage layer comprises forming a layer comprising at least one of nanocrystals and nitride.

* * * * *